(12) United States Patent
Takahashi et al.

(10) Patent No.: US 6,268,752 B1
(45) Date of Patent: Jul. 31, 2001

(54) MASTER-SLAVE FLIP-FLOP CIRCUIT

(75) Inventors: Kouji Takahashi; Yoshiji Inoue, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/456,313

(22) Filed: Dec. 8, 1999

(30) Foreign Application Priority Data

Jul. 15, 1999 (JP) .................................................. 11-201908

(51) Int. Cl.[7] .................................................... H03K 3/289
(52) U.S. Cl. .......................... 327/202; 327/204; 327/215; 327/117
(58) Field of Search ................................ 327/202, 201, 327/200, 199, 203, 204, 208, 210, 211, 212, 214, 215, 216, 217, 218, 219, 115, 117, 113, 114; 377/47

(56) References Cited

U.S. PATENT DOCUMENTS

| 4,777,388 | * | 10/1988 | Widener | 327/202 |
| 5,200,650 | * | 4/1993 | Cowley et al. | 327/202 |
| 5,359,241 | * | 10/1994 | Hasegawa et al. | 326/126 |
| 5,661,426 | * | 8/1997 | Ichimaru | 327/203 |
| 5,815,019 | * | 9/1998 | Uemura et al. | 327/202 |
| 5,844,437 | * | 12/1998 | Asazawa et al. | 327/202 |

FOREIGN PATENT DOCUMENTS 9-266435 10/1997 (JP) .
10-51278 2/1998 (JP) .

* cited by examiner

Primary Examiner—Kenneth B. Wells
Assistant Examiner—Hai L. Nguyen
(74) Attorney, Agent, or Firm—Leydig, Voit & Mayer, Ltd.

(57) ABSTRACT

A master-slave flip-flop circuiting having transistors connected in cascade in two stages between a power supply and ground. A clock differential amplifier, a master flip-flop, a slave flip-flop, and a waveform-shaping amplifier are all connected mutually in parallel to a power supply. High-speed operation at a minimum operation power supply voltage is achieved.

4 Claims, 6 Drawing Sheets

MASTER-SLAVE FLIP-FLOP CIRCUIT

FIELD OF THE INVENTION

The present invention relates to a master-slave flip-flop (F/F) circuit. More particularly, this invention relates to a master-slave flip-flop circuit having ECL (emitter coupled-logic) to be used as a frequency-dividing circuit or the like.

BACKGROUND OF THE INVENTION

FIG. 4 shows a conventional master-slave type flip-flop circuit. This master-slave type flip-flop circuit is structured by a master flip-flop MF' and a slave flip-flop SF'Transistors used in this circuit are of npn-type.

The master flip-flop MF' is structured by a differential circuit 101 for taking in input signals D and DB, a differential circuit 102 as an input stage of clocks T and TB (TB may be a reference voltage at which a high potential H level and a low potential L level of a T signal can be detected) connected in cascade to the differential circuit 101, and a potential-setting circuit RL101 for determining levels of data lines L101 and L102.

The differential circuit 101 has transistors Q101 and Q102 having collectors connected in common, and transistors Q103 and Q104 having collectors connected in common. These transistors Q101, Q102, Q103 and Q104 constitute an ECL for collectors of transistors Q105 and Q106 of the differential circuit 102. The input signals D and DB are applied to the bases of the transistors Q101 and Q104 respectively. The base of the transistor Q102 is connected to a collector common connection line of the transistors Q103 and Q104, and the base of the transistor Q103 is connected to a collector common connection line of the transistors Q101 and Q102.

The transistors Q105 and Q106 of the differential circuit 102 constitute an ECL for the collector of the transistor Q113, with clocks T and TB supplied to respective bases of these transistors Q105 and Q106. The transistor Q113 has an emitter grounded through an emitter resistor RE, and is constantly kept in an ON state due to a voltage VCB applied to the base.

The slave flip-flop SF' is structured by a differential circuit 103 for taking in signals obtained from the data lines L101 and L102, a differential circuit 104 as an input stage of clocks T and TB connected in cascade to the differential circuit 103, and a potential-setting circuit RL102 for determining levels of output signals Q and QB.

The differential circuit 103 has transistors Q107 and Q108 having collectors connected in common, and transistors Q109 and Q110 having collectors connected in common. These transistors Q107, Q108, Q109 and Q110 constitute an ECL for collectors of transistors Q11 and Q112 of the differential circuit 104.

The transistor Q107 has its base connected to the collector common connection line of the transistors Q101 and Q102 by the data line L101. The transistor Q110 has its base connected to the collector common connection line of the transistors Q103 and Q104 by the data line L102. The transistor Q108 has its base connected to a collector common connection line of the transistors Q109 and Q110. Similarly, the transistor Q109 has its base connected to a collector common connection line of the transistors Q107 and Q108. An output signal Q is taken out from the collector common connection line of the transistors Q107 and Q108. Similarly, an output signal QB is taken out from the collector common connection line of the transistors Q109 and Q110.

The transistors Q111 and Q112 of the differential circuit 104 constitute an ECL for the collector of a transistor Q114, with clocks T and TB supplied to respective bases of these transistors Q111 and Q112. The transistor Q114 has an emitter grounded through an emitter resistor RE, and is constantly kept in an ON state due to a voltage VCB applied to the base.

According to the master-slave type flip-flop circuit having the ECL structure as described above, as shown in FIG. 5, an output signal terminal (QB) and an input signal terminal (D) are short-circuited, and an output signal terminal (Q) and an input signal terminal (DB) are short-circuited. Therefore, the master-slave type flip-flop circuit operates as a frequency-dividing circuit.

Next, the operation of the frequency-dividing circuit formed by the line connection shown in FIG. 5 will be explained in four stages with reference to an input and output waveform diagram shown in FIG. 6.

At first, (1) in FIG. 6 is assumed as a first stage. When a clock T has changed from a high potential H to a low potential L, and when a clock TB has changed from a low potential L to a high potential H, the transistor Q105 of the differential circuit 102 changes from OFF to ON, the transistor Q106 changes from ON to OFF, the transistor Q111 of the differential circuit 104 changes from OFF to ON, and the transistor Q112 changes from ON to OFF.

Along with the change in the state of the differential circuit 102, the transistor Q101 of the differential circuit 101 changes from ON to OFF, the transistor Q102 changes from OFF to ON, the transistors Q103 and Q104 keep OFF state, the data line L101 keeps a low potential L, and the data line L102 keeps a high potential H, and data is held in this state.

Further, along with the change in the state of the differential circuit 104, the transistor Q107 of the differential circuit 103 keeps an OFF status, the transistor Q108 changes from ON to OFF, the transistor Q109 keeps OFF state, the transistor Q110 changes from OFF to ON, the output Q changes from a low potential L to a high potential H, and the output QB changes from a high potential H to a low potential L. Along with the changes in the status of the outputs Q and QB, the base potential of the transistor Q101 changes from a high potential H to a low potential L, and the base potential of the transistor Q104 changes from a low potential L to a high potential H.

Next, (2) in FIG. 6 is assumed as a second stage. When the clock T has changed from the low potential L to a high potential H, and when the clock TB has changed from the high potential H to a low potential L, the transistor Q105 of the differential circuit 102 changes from ON to OFF, the transistor Q106 changes from OFF to ON, the transistor Q11 of the differential circuit 104 changes from ON to OFF, and the transistor Q112 changes from OFF to ON.

Along with the change in the status of the differential circuit 102, the transistor Q101 of the differential circuit 101 keeps OFF state, the transistor Q102 changes from ON to OFF, the transistor Q103 keeps OFF state, and the transistor Q104 changes from OFF to ON, the data line L101 changes from the low potential L to a high potential H, and the data line L102 changes from a high potential H to a low potential L.

Further, along with the change in the state of the differential circuit 104, the transistors Q107 and Q108 of the differential circuit 103 keep OFF state, the transistor Q109 changes from OFF to ON, the transistor Q110 changes from ON to OFF, the output Q keeps the high potential H, and the output QB keeps the low potential L. Along with the changes in the state of the data lines L101 and L102, the base potential of the transistor Q107 changes to a low potential L, and the base potential of the transistor Q110 changes to a high potential H.

Next, (3) in FIG. 6 is assumed as a third stage. When the clock T has changed from the high potential H to a low potential L, and when the clock TB has changed from the low potential L to a high potential H, the transistor Q105 of the differential circuit 102 changes from OFF to ON, the transistor Q106 changes from ON to OFF, the transistor Q11 of the differential circuit 104 changes from OFF to ON, and the transistor Q112 changes from ON to OFF.

Along with the change in the status of the differential circuit 102, the transistors Q101 and Q102 of the differential circuit 101 keep OFF state, the transistor Q103 changes from OFF to ON, and the transistor Q104 changes from ON to OFF, the data line L101 keeps the high potential H, and the data line L102 keeps the L potential.

Further, along with the change in the state of the differential circuit 104, the transistor Q107 of the differential circuit 103 changes from OFF to ON, the transistor Q108 keeps OFF state, the transistor Q109 changes from ON to OFF, the transistor Q110 keeps OFF state, the output Q change from the high potential H to a low potential L, and the output QB changes from the low potential L to a high potential H. Along with the changes in the status of the outputs Q and QB, the base potential of the transistor Q101 changes from the low potential L to a high potential H, and the base potential of the transistor Q104 changes from the high potential H to a low potential L.

Next, (4) in FIG. 6 is assumed as a fourth stage. When the clock T has changed from the low potential L to a high potential H, and when the clock TB has changed from the high potential H to a low potential L, the transistor Q105 of the differential circuit 102 changes from ON to OFF, the transistor Q106 changes from OFF to ON, the transistor Q111 of the differential circuit 104 changes from ON to OFF, and the transistor Q112 changes from OFF to ON.

Along with the change in the state of the differential circuit 102, the transistor Q101 of the differential circuit 101 changes from OFF to ON, the transistor Q102 keeps OFF state, the transistor Q103 changes from ON to OFF, and the transistor Q104 keeps OFF state, the data line L101 changes from the high potential H to a low potential L, and the data line L102 changes from the L potential to a high potential H.

Further, along with the change in the state of the differential circuit 104, the transistor Q107 of the differential circuit 103 changes from ON to OFF, the transistor Q108 changes from OFF to ON, the transistors Q109 and Q110 keep OFF state, the output Q keeps the low potential L, and the output QB keeps the high potential H. Along with the changes in the state of the data lines L101 and L102, the base potential of the transistor Q107 changes to a high potential H, and the base potential of the transistor Q110 changes to a low potential L.

By repeating the operation of above-described stages (1) to (4), the conventional circuit has been utilized as a frequency-dividing circuit.

As a further example of the conventional master-slave type flip-flop circuit, there has been known a system for carrying out a passing and interrupting of data signals, by parallel connecting a pair of clock input differential units and a pair of data input latch differential units, and by applying a clock signal to the bases of the transistors of the pair of data input latch differential units, as disclosed in Japanese Patent Application Laid-open No. HEI 9-266435 and Japanese Patent Application Laid-open No. HEI 10-51278.

According to the prior-art master-slave type flip-flop circuit shown in FIG. 4 and FIG. 5, the transistors between the power supply and the ground in a semiconductor integrated circuit are constructed in three stages in cascade connection. Accordingly, as a minimum operation power supply voltage, a voltage of 2Vbe (a voltage between the base and the emitter) plus Vsat (a saturation voltage between the collector and the emitter) plus a constant current emitter resistance voltage drop (IE×RE) is at least required. If the power supply voltage is lower than this then there a problem that the flip-flops cannot operate.

In general, portable communication devices such as portable telephones and PHSs (Personal Handiphone Systems) are operated by using batteries as a power source. Therefore, when the prior-art master-slave type flip-flop circuit as shown in FIG. 4 and FIG. 5 is used as a circuit for frequency-dividing a high-frequency signal, this circuit requires a large power consumption because of its high minimum operation power supply voltage. Therefore, it is not possible to make call time and wait time longer.

In order to solve the above problems, in the above-described conventional master-slave type flip-flop circuit, an attempt has been made to lower the power supply voltage by decreasing a logical amplitude voltage (VM) and the constant current voltage drop (IE×RE). However, as the transistors between the power supply VCC and the ground GND in the semiconductor integrated circuit are constructed in three stages in cascade connection, it is not possible to drive the circuit at a low voltage of 2 V or below. Therefore, there has been a limit to the reduction in power consumption.

The master-slave type flip-flop circuit as disclosed in Japanese Patent Application Laid-open No. 9-266435 and Japanese Patent Application Laid-open No. 10-51278 has a parallel connection of the pair of clock input differential units and the pair of data input latch differential units. Therefore, as compared with the prior-art master-slave type flip-flop circuit as shown in FIG. 4 and FIG. 5, the minimum operation power supply voltage is lower and the circuit can be driven at a low voltage of 2 V or below. However, there is a limit to increasing the operation speed because of the circuit structure.

SUMMARY OF THE INVENTION

This inventions has been made in light of the above problems. It is an object of the present invention to provide a master-slave type flip-flop circuit having a circuit structure capable of achieving a high-speed operation at a low minimum operation power supply voltage. The master-slave type flip-flop circuit has transistors connected in cascade in two stages between the power supply and the ground in the same manner as the master-slave type flip-flop circuit of a type having a pair of clock input differential units and a pair of data input latch differential units connected in parallel.

In the master-slave type flip-flop circuit according to the present invention, all of the clockdifferential amplifier, the master flip-flop, the slave flip-flop and the waveform-shaping amplifier are in parallel connection in the same phase with respect to the power supply. Accordingly, transistors are connected in cascade in two stages between the power supply VCC the ground GND. Therefore, and this circuit can be operated at 2 V or below by VRE+Vsat+VBE+VRL. Furthermore, a high-speed operation becomes possible according to the circuit structure.

Other objects and features of this invention will become apparent from the following description with reference to the accompanying drawings.

DESCRIPTION OF THE PREFERRED EMBODIMENTS

Embodiments of the master-slave type flip-flop circuit relating to the present invention will be explained in detail below with reference to the attached drawings.

Figure 1:
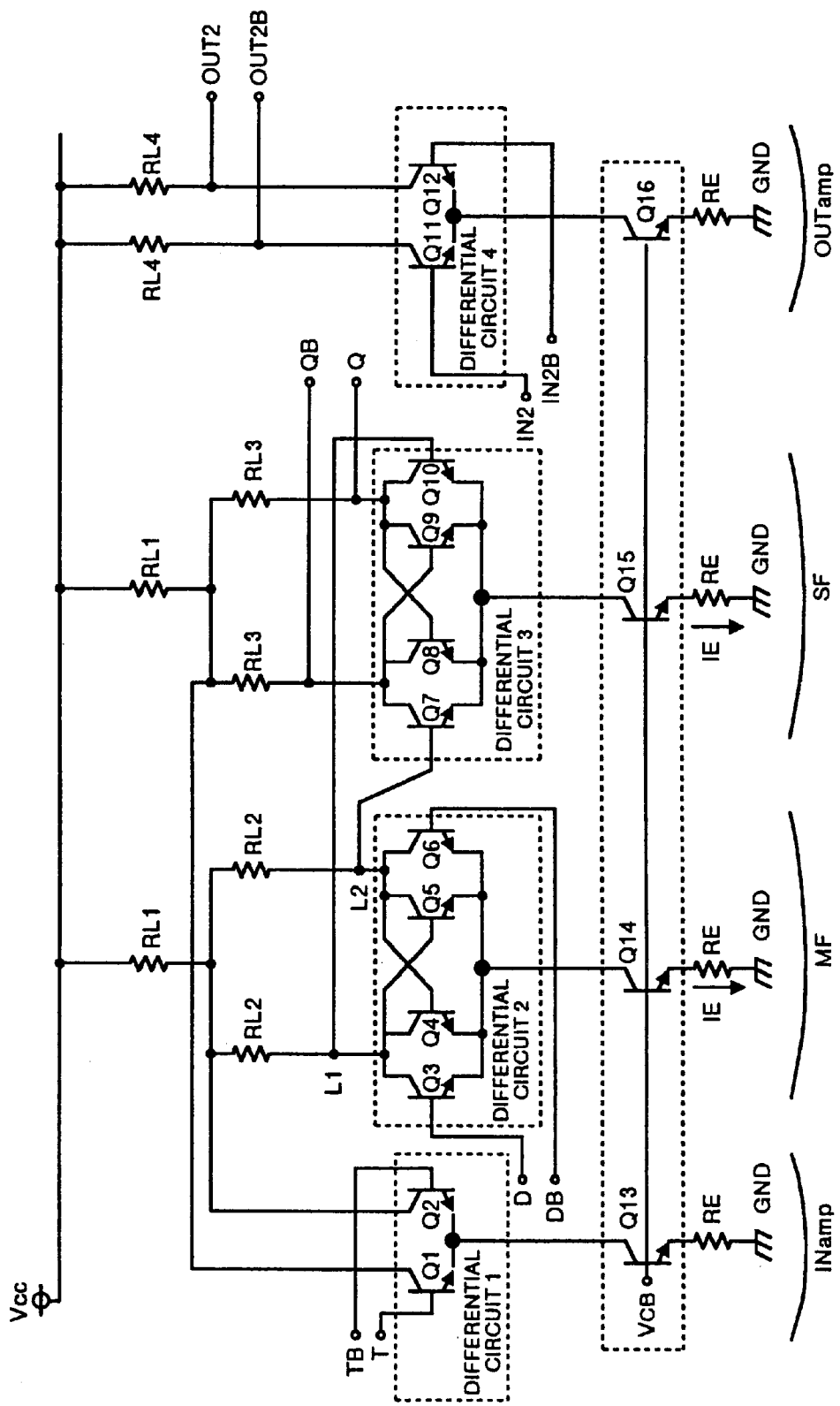
FIG. 1 is a circuit diagram which shows an embodiment of a master-slave type flip-flop circuit according to the present invention.

FIG. 1 shows a master-slave type flip-flop circuit according to the present invention. The master-slave type flip-flop circuit includes by a clock differential amplifier INamp, a master flip-flop MF, a slave flip-flop SF, and a waveform-shaping amplifier OUTamp, all connected mutually in parallel with a power supply VCC. All transistors used in this circuit are npn type.

The clock differential amplifier INamp includes by a differential circuit 1 as an input stage of clocks T and TB (TB may be a reference voltage for detecting a high potential H level and a low potential L level of the T signal), data lines L1 and L2, and a primary-potential setting circuit RL1 for outputs Q and QB.

The transistors Q1 and Q2 of the differential circuit 1 constitute an ECL for the collector of a transistor Q13, and have clock signals T and TB input to respective bases thereof. The transistor Q13 has an emitter grounded through an emitter resistor RE, and is constantly kept in an ON state due to a voltage VCB applied to the base.

The master flip-flop MF includes by a differential circuit 2 for taking in input signals D and DB, and a secondary-potential setting circuit RL2 of the data lines L1 and L2.

The differential circuit 2 includes transistors Q3 and Q4 having collectors connected in common, and transistors Q5 and Q6 having collectors connected in common. The transistors Q3, Q4, Q5 and Q6 constitute an ECL for the collector of a transistor Q14.

The transistors Q3 and Q6 receive input signals D and DB applied to the bases thereof, and the transistor Q4 has its base connected to a collector common connection line of the transistors Q5 and Q6. The transistor Q5 has its base connected to a collector common connection line of the transistors Q3 and Q4. The transistor Q14 has its emitter grounded through an emitter resistor RE, and is constantly kept in an ON state due to a voltage VCB applied to the base.

The slave flip-flop SF is structured by a differential circuit 3 for taking in signals obtained from the data lines L1 and L2, and a secondary-potential setting circuit RL3 for determining potentials of the outputs Q and QB.

The differential circuit 3 includes transistors Q7 and Q8 having collectors connected in common, and transistors Q9 and Q10 having collectors connected in common. The transistors Q7, Q8, Q9 and Q10 constitute an ECL for the collector of a transistor Q15.

The transistor Q7 has its base connected to a collector common connection line of the transistors Q5 and Q6 by the data line L2. The transistor Q10 has its base connected to a collector common connection line of the transistors Q3 and Q4 by the data line L1. The output signal Q is taken out from the collector common connection line of the transistors Q9 and Q10, and the output signal QB is taken out from the collector common connection line of the transistors Q7 and Q8. The transistor Q15 has its emitter grounded through an emitter resistor RE, and is constantly kept in an ON state due to a voltage VCB applied to the base.

The waveform-shaping amplifier OUTamp includes by a differential amplifier 4 for amplifying waveforms of the outputs Q and QB to shape the waveforms, and a potential-setting circuit RL4 for final outputs OUT2 and OUT2B.

Transistors Q11 and Q12 of a differential circuit 4 constitute an ECL for the collector of a transistor Q16. As shown in the arrangement of the frequency divider of FIG. 2, output signals Q and QB from the slave flip-flop SF are applied to the bases of the transistors Q11 and Q12, and the final output signals OUT2 and OUT2B are output from respective collectors thereof. The transistor Q16 has an emitter grounded through an emitter resistor RE, and is constantly kept in an ON state due to a voltage VCB applied to the base.

Figure 2:
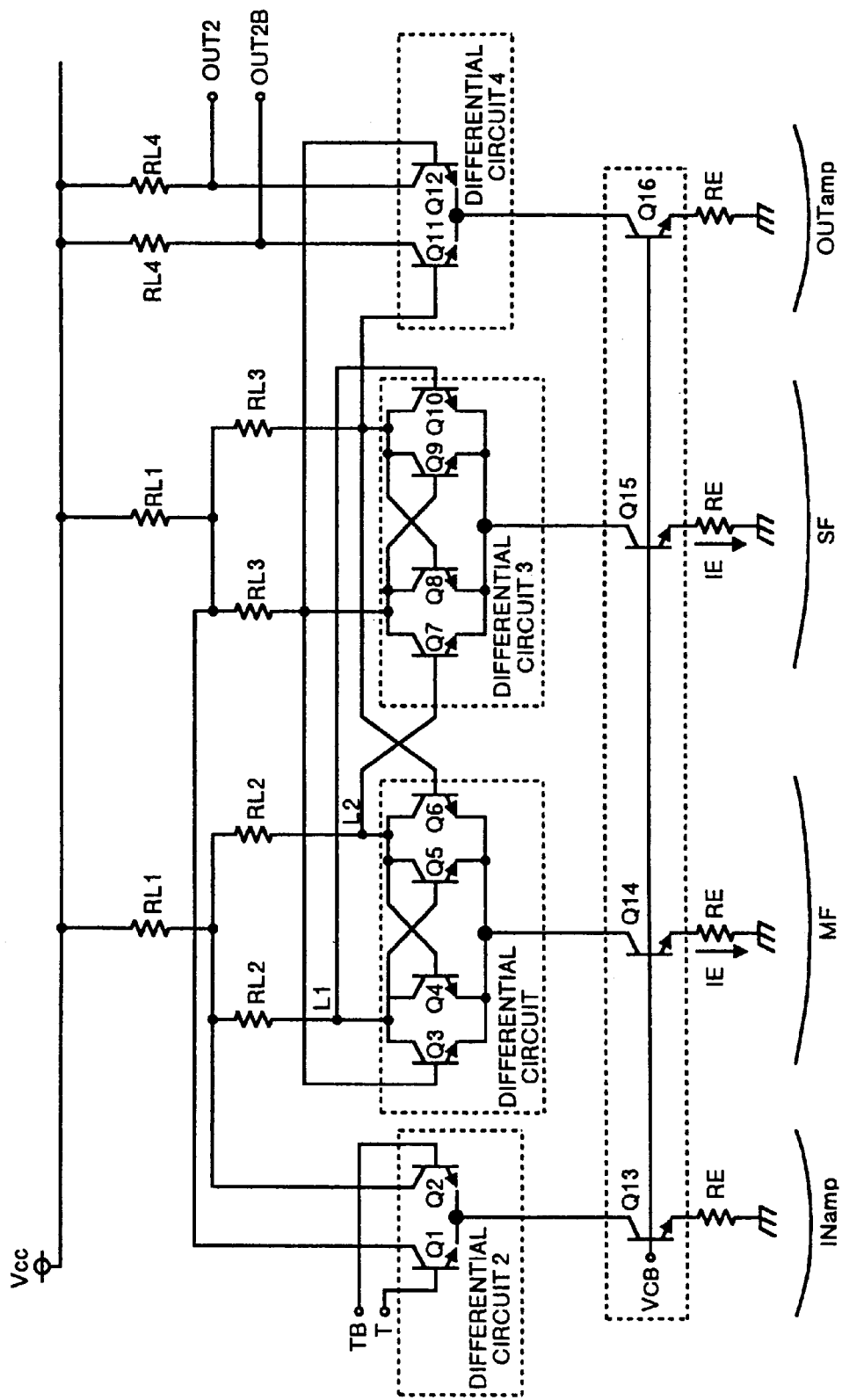
FIG. 2 is a circuit diagram which shows a master-slave type flip-flop circuit according to the present invention as a frequency divider.

According to the master-slave type flip-flop circuit having the ECL structure as described above, an output signal terminal (QB) and an input signal terminal (D) are short-circuited, and an output signal terminal (Q) and an input signal terminal (DB) are short-circuited, as shown in FIG. 2. Therefore, the master-slave type flip-flop circuit operates as a frequency-dividing circuit.

Next, the operation of the frequency-dividing circuit formed by the line connection shown in FIG. 2 will be explained in four stages with reference to an input and output waveform diagram shown in FIG. 3.

Figure 3:
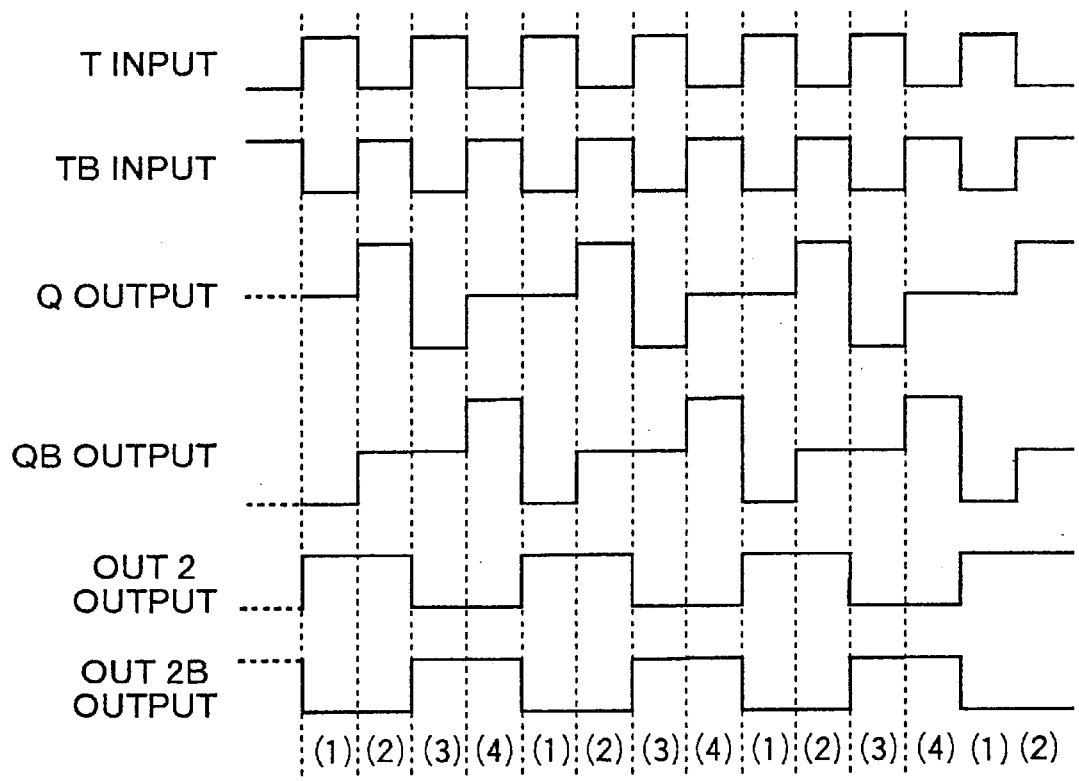
FIG. 3 is an input/output waveform diagram which shows a master-slave type flip-flop circuit according to the present invention used as a frequency divider.
Figure 4:
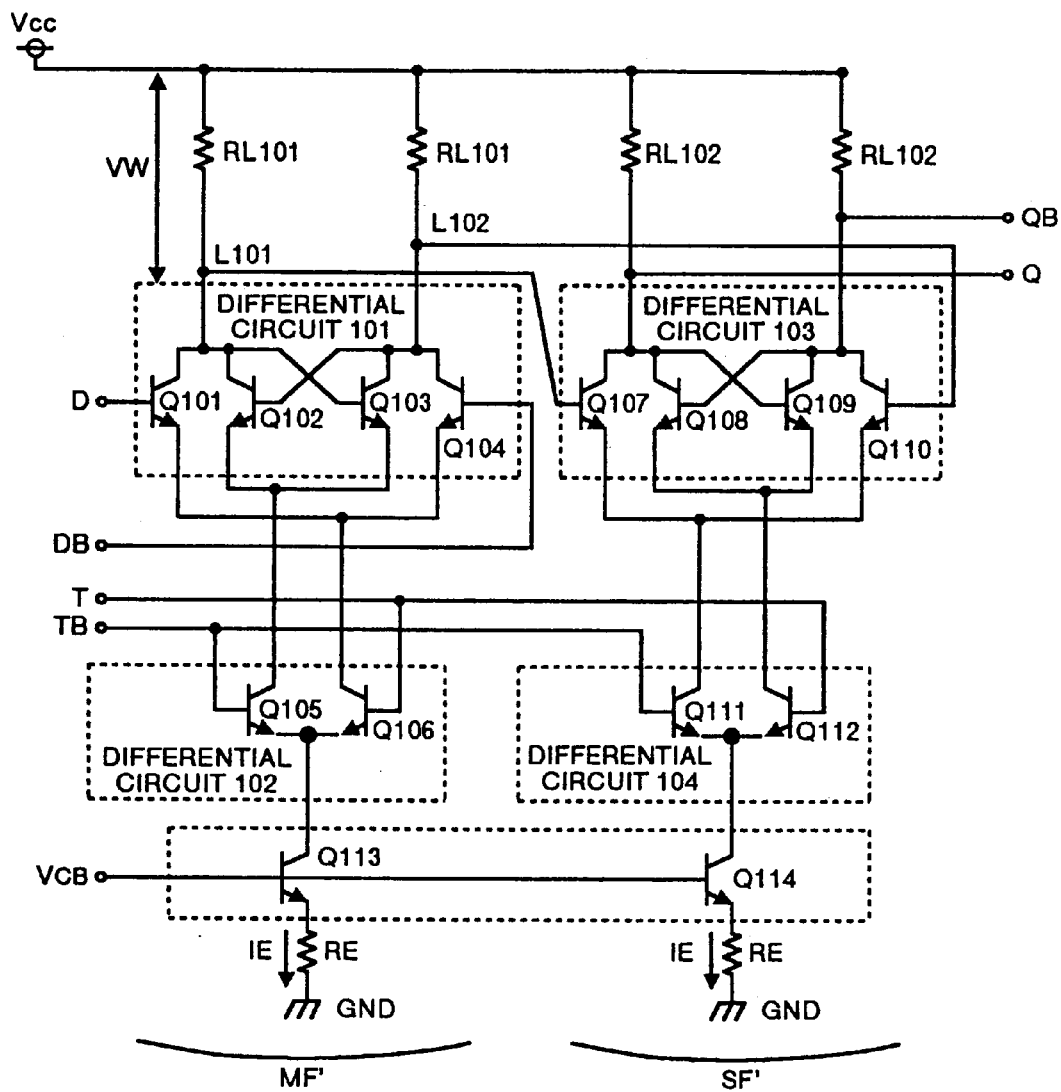
FIG. 4 is a circuit diagram which shows a conventional master-slave type flip-flop circuit.
Figure 5:
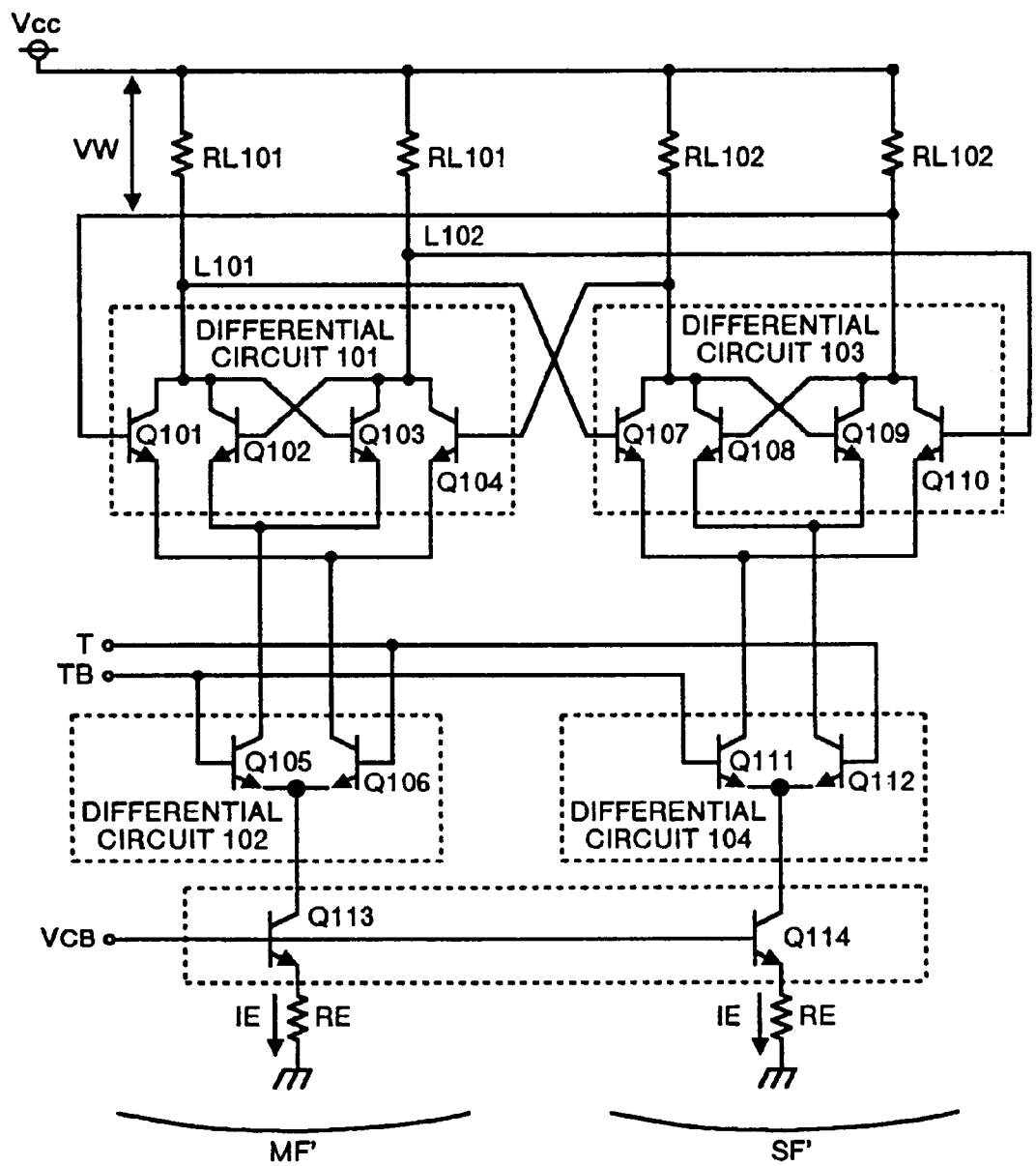
FIG. 5 is a circuit diagram which shows a prior-art master-slave type flip-flop circuit is used as a frequency divider.
Figure 6:
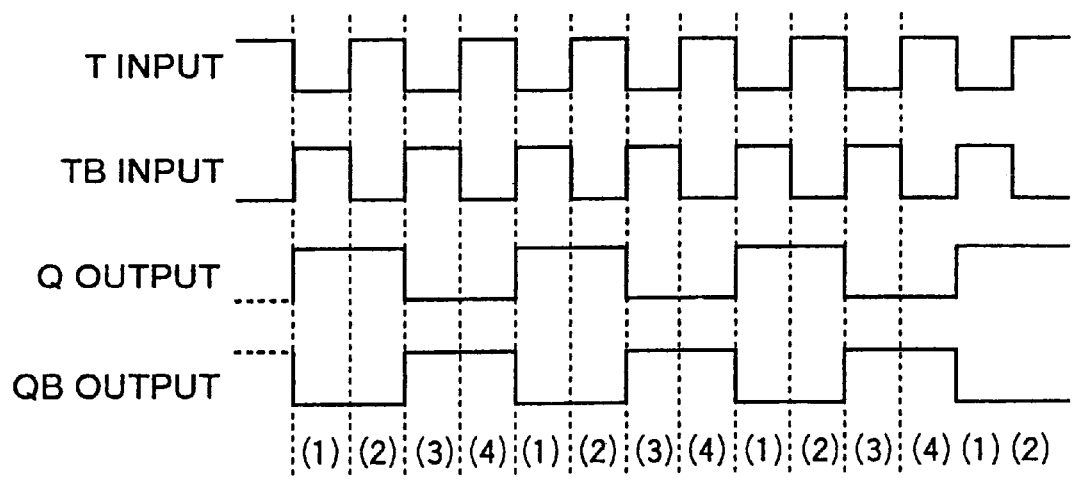
FIG. 6 is an input/output waveform diagram which shows the prior-art master-slave type flip-flop circuit used as a frequency divider.

At first, (1) in FIG. 3 is assumed as a first stage. When a clock T has changed from a low potential L to a high potential H, and when a clock TB has changed from a high potential H to a low potential L, the transistor Q1 of the differential circuit 1 changes from OFF to ON, and the transistor Q2 changes from ON to OFF.

Along with the change in the state of the differential circuit 1, the potential of the collector of the transistor Q1 as a potential of the lower stage of the primary-potential setting circuit RL1 changes from a high potential H to a low potential L, the potential of the collector of the transistor Q2 changes from a low potential L to a high potential H. Similarly, along with the change in the state of the differential circuit 1, the transistor Q3 of the differential circuit 2 changes from ON to OFF, the transistor Q4 changes from OFF to ON, transistors Q5 and Q6 keep OFF state, the potential of the data line L1 changes from a low potential L to an intermediate potential M, and the potential of the data line L2 changes from an intermediate potential M to a high potential H.

Further, along with the change in the state of the differential circuit 2, the transistor Q7 of the differential circuit 3 changes from OFF to ON, the transistor Q8 keeps OFF state, the transistor Q9 changes from ON to OFF, the transistor Q10 keeps OFF state, the output QB changes from a high potential H to a low potential L, and the output Q keeps an intermediate potential M. In this case, as the output Q and the output QB have their potential differences amplified by the differential circuit 4, the transistor Q11 changes from ON to OFF, the transistor Q12 changes from ON to OFF, the output OUT2 changes from a low potential L to a high potential H, and the OUT2B changes from a high potential H to a low potential L.

Next, (2) in FIG. 3 is assumed as a second stage. When the clock T has changed from the high potential H to a low potential L, and when the clock TB has changed from the low potential L to a high potential H, the transistor Q1 of the differential circuit 1 changes from ON to OFF, and the transistor Q2 changes from OFF to ON.

Along with the change in the status of the differential circuit 1, the potential of the collector of the transistor Q1 as a potential of the lower stage of the primary-potential setting circuit RL1 changes from the low potential L to a high potential H, the potential of the collector of the transistor Q2 changes from the high potential H to a low potential L. Similarly, along with the change in the state of the differential circuit 1, the transistor Q3 of the differential circuit 2 keeps OFF state, the transistor Q4 changes from ON to OFF, the transistor Q5 keeps OFF state, the transistor Q6 changes from OFF to ON, the potential of the data line L1 keeps the intermediate potential M, and the potential of the data line L2 changes from the high potential H to a low potential L.

Further, along with the change in the state of the differential circuit 2, the transistor Q7 of the differential circuit 3 changes from ON to OFF, the transistor Q8 changes from OFF to ON, the transistor Q9 keeps OFF state, the transistor Q10 keeps OFF state, the output QB changes from the low potential L to an intermediate potential M, and the output Q changes from the intermediate potential M to a high potential H. In this case, as the output Q and the output QB have their potential differences amplified by the differential circuit 4, the transistor Q11 keeps ON state, the transistor Q12 keeps ON state, the output OUT2 keeps the high potential H, and the OUT2B keeps the low potential L.

Next, (3) in FIG. 3 is assumed as a third stage. When the clock T has changed from the low potential L to a high potential H, and when the clock TB has changed from the high potential H to a low potential L, the transistor Q1 of the differential circuit 1 changes from OFF to ON, and the transistor Q2 changes from ON to OFF.

Along with the change in the state of the differential circuit 1, the potential of the collector of the transistor Q1 as a potential of the lower stage of the primary-potential setting circuit RL1 changes from the high potential H to a low potential L, the potential of the collector of the transistor Q2 changes from the low potential L to a high potential H. Similarly, along with the change in the state of the differential circuit 1, the transistor Q3 of the differential circuit 2 keeps OFF state, the transistor Q4 keeps OFF state, the transistor Q5 changes from OFF to ON, the transistor Q6 changes from ON to OFF, the potential of the data line L1 changes from the intermediate potential M to a high potential H, and the potential of the data line L2 changes from the low potential L to an intermediate potential M.

Further, along with the change in the state of the differential circuit 2, the transistor Q7 of the differential circuit 3 keeps OFF state, the transistor Q8 changes from ON to OFF, the transistor Q9 keeps OFF state, the transistor Q1O changes from OFF to ON, the output QB keeps the intermediate potential M, and the output Q changes from the high potential H to a low potential L. In this case, as the output Q and the output QB have their potential differences amplified by the differential circuit 4, the transistor Q11 changes from ON to OFF, the transistor Q12 changes from OFF to ON, the output OUT2 changes from the high potential H to a low potential L, and the OUT2B changes from the low potential L to a high potential H.

Next, (4) in FIG. 3 is assumed as a fourth stage. When the clock T has changed from the high potential H to a low potential L, and when the clock TB has changed from the low potential L to a high potential H, the transistor Q1 of the differential circuit 1 changes from ON to OFF, and the transistor Q2 changes from OFF to ON.

Along with the change in the state of the differential circuit 1, the potential of the collector of the transistor Q1 as a potential of the lower stage of the primary-potential setting circuit RL1 changes from the low potential L to a high potential H, the potential of the collector of the transistor Q2 changes from the high potential H to a low potential L. Similarly, along with the change in the state of the differential circuit 1, the transistor Q3 of the differential circuit 2 changes from OFF to ON, the transistor Q4 keeps OFF state, the transistor Q5 changes from ON to OFF, the transistor Q6 keeps OFF state, the potential of the data line L1 changes from the high potential H to a low potential L, and the potential of the data line L2 keeps the intermediate potential M.

Further, along with the change in the state of the differential circuit 2, the transistor Q7 of the differential circuit 3 keeps OFF state, the transistor Q8 keeps OFF state, the transistor Q9 changes from OFF to ON, the transistor Q10 changes from ON to OFF, the output QB changes from the intermediate potential M to a high potential H, and the output Q changes from the low potential L to an intermediate potential M. In this case, as the output Q and the output QB have their potential differences amplified by the differential circuit 4, the transistor Q11 keeps OFF state, the transistor Q12 keeps ON state, the output OUT2 keeps the low potential L, and the OUT2B keeps the high potential H.

Although the output waveforms of the outputs Q and QB of the slave flip-flop SF are not ½ frequency-divided, it is possible to produce an output of a ½ frequency-divided waveform based on a series of operation from (1) to (4), by providing the differential amplifier 4 at the output.

Further, this master-slave type flip-flop circuit has transistors connected in cascade in two stages between the power supply VCC and the ground GND, and can be operated at 2 V or below by VRE+Vsat+VBE+VRL. Furthermore, a high-speed operation becomes possible according to the circuit structure.

As described above, with the master-slave type flip-flop circuit according to the present invention, all of the clock differential amplifier, the master flip-flop, the slave flip-flop and the waveform-shaping amplifier are in parallel connection in the same phase with respect to the power supply. Accordingly, transistors are connected in cascade in two stages between the power supply VCC and the ground GND, and this circuit can be operated at 2 V or below by VRE+ Vsat+VBE+VRL. Furthermore, a high-speed operation becomes possible according to the circuit structure.

Further, as the transistors of each differential circuit constitute an ECL for the collector of the transistor for each differential circuit at the ground side, this circuit is structured as a digital standard monolithic logic circuit for high-speed operation, making it possible to achieve both a high-speed operation and a reduction in power consumption.

Further, when the terminal of an input signal of the differential circuit of the master flip-flop and the terminal of an output signal of the slave flip-flop are short-circuit connected, a ½ frequency divider capable of achieving both a high-speed operation and a reduction in power consumption can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A master-slave flip-flop circuit comprising:

a primary power supply line and a ground line;

a clock differential amplifier connected between the primary power line and said ground line, and including a first differential circuit as an input stage for a clock signal and producing an output, the first differential circuit having a first pair of bipolar transistors and a first emitter coupled logic bipolar transistor connected between said ground line and said first pair of bipolar transistors, a data line, and a primary-potential setting circuit, wherein said primary potential-setting circuit is connected between said primary power line and said first differential circuit so that only two bipolar transistors are connected in series between said primary power line and said ground line;

a master flip-flop including a second differential circuit receiving an input signal, said second differential circuit having a second pair of bipolar transistors and a second emmitter coupled logic bipolar transistor connected between said ground line and said second pair of bipolar transistors, and a first secondary-potential setting circuit for determining the potential of said data line, wherein said first secondary-potential setting circuit is connected between said primary power line and said second differential circuit so that only two bipolar transistors are connected in series between said primary power line and said ground line;

a slave flip-flop including a third differential circuit receiving a data signal from said master flip-flop obtained from said data line, said third differential circuit having a third pair of bipolar transistors and a third emitter coupled logic bipolar transistor connected between said ground line and said third pair of bipolar transistors, and a second secondary-potential setting circuit for determining a potential of an output of said slave flip-flop, wherein said second secondary-potential setting circuit is connected between said primary power line and said third differential circuit so that only two bipolar transistors are connected in series between said primary power line and said ground line; and a waveform-shaping amplifier including a fourth differential circuit for amplifying and shaping an output of said slave flip-flop circuit, said fourth differential circuit having a fourth pair of bipolar transistors and a fourth emitter coupled logic bipolar transistor connected between said ground line and said fourth pair of bipolar transistor, and a third potential-setting circuit for determining a potential of a final output of said master-slave flip-flop circuit, wherein said third potential-setting circuit is connected between said primary power line and said fourth differential circuit so that only two bipolar transistors are connected in series between said primary power line and said ground line, whereby said master-slave flip-flop circuit may be operated at a lower voltage between said primary power line and said ground line than a master-slave flip-flop circuit including more than two bipolar transistors connected in series between a primary power line and a ground line.

2. The master-slave flip-flop circuit according to claim 1, wherein an input terminal of said second differential circuit and an output terminal of said slave flip-flop are short circuited and connected to an input terminal of said waveform-shaping amplifier, whereby said master-slave flip-flop circuit is a divide-by-two frequency divider.

3. The master-slave flip-flop circuit according to claim 1, wherein each of said first, second, and third emitter coupled logic transistor of each of the first, second, and third differential circuits at a ground side bipolar transistors has a respective emitter connected to said ground line through a respective emitter resistor and a respective base supplied with a constant voltage.

4. The master-slave flip-flop circuit according to claim 3, wherein an input terminal of said second differential circuit and an output terminal of said slave flip-flop are short circuited and connected to an input terminal of said waveform-shaping amplifier, whereby said master-slave flip-flop circuit is a divide-by-two frequency divider.

* * * * *

UNITED STATES PATENT AND TRADEMARK OFFICE
CERTIFICATE OF CORRECTION

PATENT NO. : 6,268,752 B1
DATED : July 31, 2001
INVENTOR(S) : Takahashi et al.

It is certified that error appears in the above-identified patent and that said Letters Patent is hereby corrected as shown below:

Title page,
Item [73], should read -- Mitsubishi Denki Kabushiki Kaisha and Mitsubishi Electric Engineering Co., Ltd., both of Tokyo (JP). --

Signed and Sealed this

First Day of January, 2002

Attest:

*Attesting Officer*

JAMES E. ROGAN
*Director of the United States Patent and Trademark Office*